United States Patent
McCune, Jr. et al.

[11] Patent Number: 5,952,895
[45] Date of Patent: Sep. 14, 1999

[54] DIRECT DIGITAL SYNTHESIS OF PRECISE, STABLE ANGLE MODULATED RF SIGNAL

[75] Inventors: Earl W. McCune, Jr., Santa Clara; Wendell Sander, Los Gatos, both of Calif.

[73] Assignee: Tropian, Inc., Cupertino, Calif.

[21] Appl. No.: 09/027,954

[22] Filed: Feb. 23, 1998

[51] Int. Cl.$^6$ ............................... H03C 3/08; H03C 3/09
[52] U.S. Cl. ...................... 332/128; 455/113; 455/119
[58] Field of Search ............................... 332/127, 128; 455/113, 119

[56] References Cited

U.S. PATENT DOCUMENTS

| | | | |
|---|---|---|---|
| 4,282,497 | 8/1981 | Hulbert | 332/128 |
| 4,755,774 | 7/1988 | Heck | 332/123 |
| 5,834,985 | 11/1998 | Sundegard | 332/100 |

*Primary Examiner*—Siegfried H. Grimm
*Attorney, Agent, or Firm*—Burns, Doane, Swecker & Mathis, LLP

[57] ABSTRACT

The present invention, generally speaking, provides an RF modulator that allows precise, stable phase shifts to be obtained. The modulator uses a PLL structure including an auxiliary feedforward path used to inject a baseband modulation signal into the PLL at a point past a loop filter of the PLL. A phase demodulator recovers phase information from the output signal of the PLL. The recovered phase information is compared to the phase information of the baseband modulation signal. A resulting error signal is used to control injection of the baseband modulation signal into the PLL, to automatically achieve the correct "dosage." A precise, adaptive, phase-stable modulator results. The adaptation of the modulator compensates for variability of the VCO and other components of the PLL.

14 Claims, 2 Drawing Sheets

DIRECT DIGITAL SYNTHESIS OF PRECISE, STABLE ANGLE MODULATED RF SIGNAL

BACKGROUND OF THE INVENTION

1. Field of the Invention

The present invention relates to radio frequency modulators, particularly digital radio frequency modulators.

2. State of the Art

Modulation can be defined as the alteration of some characteristic of a known signal or waveform, i.e., a carrier, as a function of some unknown signal or waveform that conveys information. In radio-frequency (RF) communication systems, the carrier is typically a sinusoid, and there are several methods of modulating the carrier. These include linear modulation, angle modulation, and various types of pulse modulation. Given a sinusoidal carrier described by the equation $A(t)\cos(\omega_c t+\phi(t))$, there are two parameters, the amplitude and the phase angle, that can be varied in accordance with an information signal. Linear modulation results when the amplitude is varied as a linear function of the information signal. Angle modulation includes phase modulation and frequency modulation. If a term is included in the argument of the sinusoidal function that varies in proportion to the information signal, the result is phase modulation. If the argument is such that the difference in the instantaneous frequency and the carrier frequency is proportional to the information signal, the result is frequency modulation.

Demodulation of RF signals has typically involved a quadrature detector having two branches, an I ("in-phase") branch and a Q ("quadrature" or 90° phase-shifted) branch. In the I branch, a received signal is multiplied by the cosine form of the carrier signal and then passed through a low-pass filter. In the Q branch, the received signal is multiplied by the sine form of the carrier signal and passed through a low-pass filter. Quadrature detectors of this type are linear, well-understood, and almost universally used. To obtain the information signal from the I and Q components produced by the respective I and Q branches of the quadrature detector, signal processing is performed. In particular, the phase of the signal may be obtained by taking the inverse tangent of the ratio of Q to I. The amplitude of the signal may be obtained according to the Pythagorean theorem by taking the square root of the sum of the squares of I and Q. These mathematical operations are non-linear.

Two salient observations may therefore be made concerning quadrature detection. First, detection proceeds in two steps, a first mixing step (to obtain I and Q) that is linear and a second signal processing step to which non-linearities are relegated. Second, a coordinate system conversion is first performed and then reversed. That is, the received signal, which may be readily described in polar coordinates in terms of the desired quantities of amplitude and phase, is first converted to rectangular coordinates by projecting the instantaneous signal vector in polar coordinates onto the X (I) and Y (Q) axes, and is then converted back to polar coordinates to obtain amplitude and phase. Such conversions require circuitry that occupies space and consumes power—both of which may be precious commodities, especially in mobile applications such as cellular telephones, pagers, etc. Such conversions may also entail substantial inaccuracies.

A similar situation exists on the transmit side with respect to RF modulators. That is, amplitude and phase information is originally represented in polar form. I and Q processing is then performed in which amplitude and phase information is encoded as I and Q signals which are then converted back to polar form and summed to form the final output signal. This process is illustrated in FIG. 1. One widely used type of modulation, Phase Shift Keying (PSK), requires the transmit signal to undergo accurate phase shifts and to exhibit good phase stability. PSK is used in GSM cellular telephones, for example. A conventional modulator of the quadrature type, while it exhibits good phase stability, achieves only marginal accuracy. Sophisticated coding schemes may be required to compensate for inaccuracies of the modulator, and performance under noisy conditions may noticeably deteriorate.

Beside conventional quadrature techniques, various other modulation techniques are known. In one such technique, a phase lock loop (PLL) is used to multiply a modulated signal in frequency and phase to obtain a high frequency signal (e.g., 900 MHz). Referring to FIG. 2, a PLL includes a phase detector 201, a loop filter 203, a Voltage Controlled Oscillator (VCO) 205, and a divide by N counter 207. the case of a 900 MHz output signal, a typical divisor might be 64, for example. If a modulated signal $\cos(\omega_c t+\phi(t))$ is applied to the input of the circuit, then ideally, a modulated signal $\cos(N\omega_c t+\phi(t))$ is produced at the output of the circuit. The stability of the circuit, however, is poor unless the loop filter is made to have a narrow bandwidth. With a narrow bandwidth loop filter, the circuit is no longer able to track rapid changes in the modulated input signal, producing inaccuracies in the modulated output signal.

To overcome the foregoing difficulty, an arrangement shown in FIG. 3 has been devised. A baseband modulation signal is applied to a Voltage Controlled Crystal Oscillator (VCXO) 309 to produce a modulated signal which is applied to the input of a PLL, as before. An additional feedforward path is used to inject the baseband modulation signal into the PLL at a point past the loop filter. More particularly, the baseband modulation signal is applied to an adjustable gain amplifier 311. The output of the adjustable gain amplifier is applied to an adder 313 situated between the loop filter and the VCO. The gain of the amplifier is adjusted so that the effects of the loop filter in removing some of the modulation is precisely offset by reinjecting the modulation signal. Unfortunately, achieving precisely the correct adjustment is a painstaking manual process. Furthermore, although sufficient precision may be obtained for FM radio communications, the precision required for PSK radio communications is lacking.

SUMMARY OF THE INVENTION

The present invention, generally speaking, provides an RF modulator that allows precise, stable phase shifts to be obtained. The modulator uses a PLL structure including an auxiliary feedforward path used to inject a baseband modulation signal into the PLL at a point past a loop filter of the PLL. A phase demodulator recovers phase information from the output signal of the PLL. The recovered phase information is compared to the phase information of the baseband modulation signal. A resulting error signal is used to control injection of the baseband modulation signal into the PLL, to automatically achieve the correct "dosage." A precise, adaptive, phase-stable modulator results. The adaptation of the modulator compensates for variability of the VCO and other components of the PLL.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
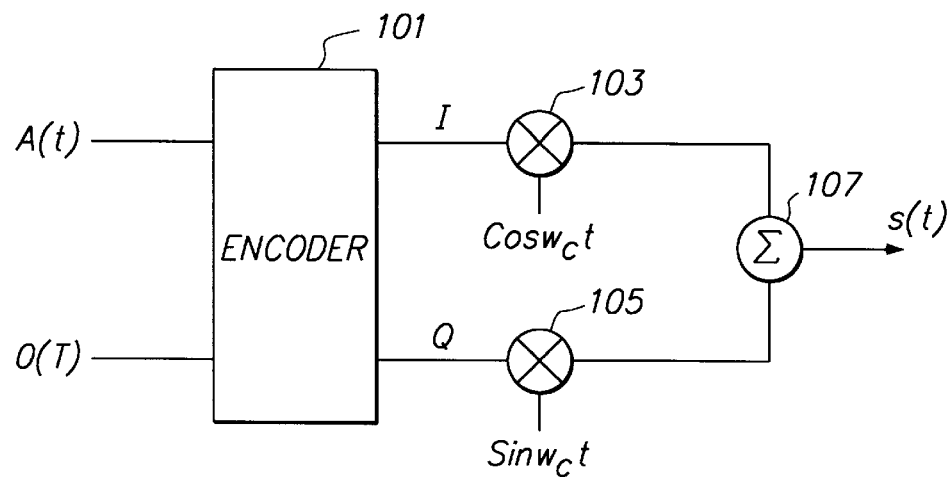
FIG. 1 is a block diagram of a conventional quadrature RF modulator.
Figure 2:
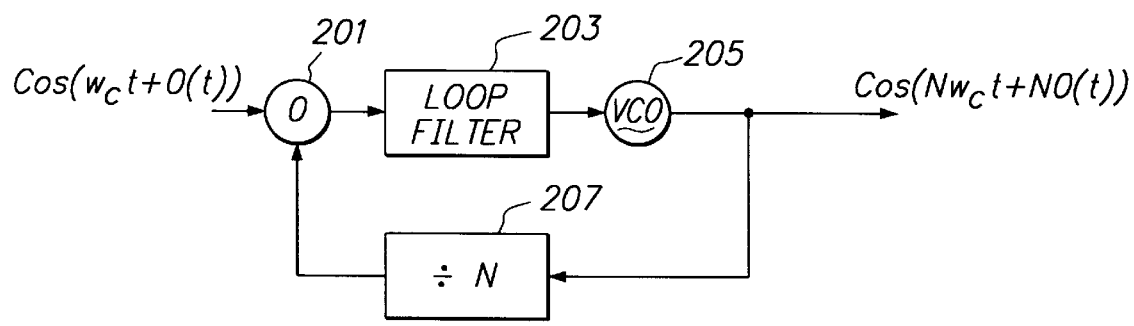
FIG. 2 is a block diagram of a conventional PLL-based RF modulator.
Figure 3:
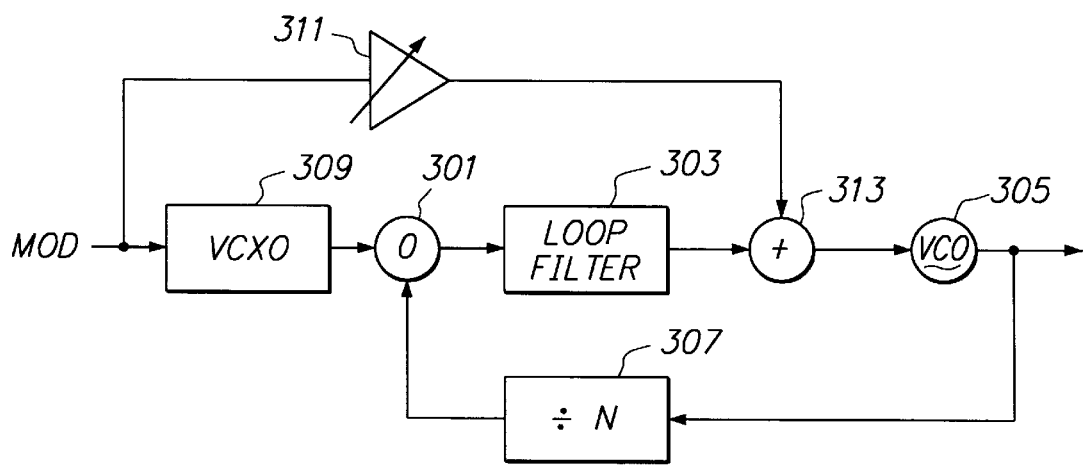
FIG. 3 is a block diagram of a conventional PLL-based RF modulator having a baseband modulation signal injection feature.
Figure 4:
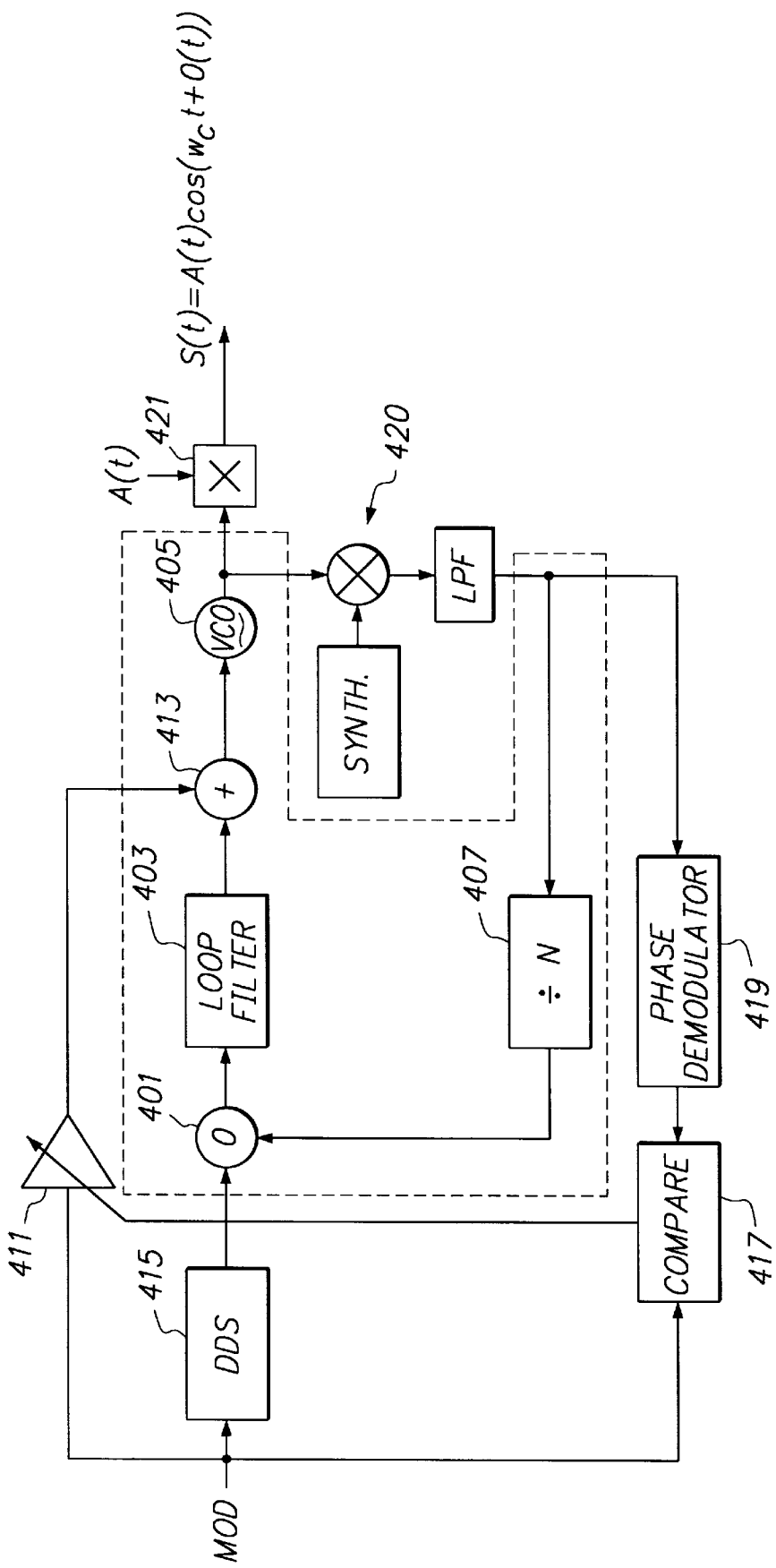
FIG. 4 is a block diagram of an RF modulator in accordance with the present invention.

Referring now to FIG. 4, a block diagram of an RF modulator in accordance with the present invention is shown. A portion of the modulator indicated within dashed lines is substantially the same as a corresponding portion of the conventional modulator of FIG. 3. Optionally, the modulator of FIG. 4 may include a downconverter 420 consisting of a frequency synthesizer, a mixer and a low pass filter. In instances where the output frequency of the modulator is very high, the downconverter reduces the frequency to one that may be more readily handled by the divide by N counter. Note, however, that in other instances N may be equal to one. Also, the modulator of FIG. 4 may optionally include an amplitude modulation stage 421. In some modulation schemes, both the amplitude and phase characteristics of the signal may be modulated, in which instance the amplitude modulation stage is used to impart the desired amplitude modulation.

Preferably, instead of the VCXO of FIG. 3, the modulator of FIG. 4 uses a Direct Digital Synthesis (DDS) circuit 415 to produce a modulated input signal that is applied as a reference signal to the PLL. Such a DDS circuit may be based upon a known Number Controlled Modulated Oscillator (NCMO) described in U.S. Pat. No. 4,746,880 issued May 24, 1988, entitled Number Controlled Modulated Oscillator, incorporated herein by reference. A baseband modulation signal is applied to the DDS circuit to produce the modulated input signal, which is then applied as a reference signal to the PLL.

The stability and precision of the present modulator derive from an additional feedback loop including a phase demodulator 419 and a comparison circuit 417. The phase demodulator may be of a type described in U.S. patent application Ser. No. 09/006,938 (Atty. Dkt. No. 32219-003), entitled DIGITAL PHASE DISCRIMINATIONS BASED ON FREQUENCY SAMPLING, filed Jan. 14, 1998, incorporated herein by reference.

The phase demodulator 419 recovers phase information from the output signal of the PLL. Using a comparison circuit 417, the recovered phase information is compared to the phase information of the baseband modulation signal. A resulting error signal is used to control injection of the baseband modulation signal into the PLL, to automatically achieve the correct "dosage." That is, an output signal of the comparison circuit 417 sets the gain of the adaptive gain amplifier 411 to the value required in order to match the phase information carried by the output signal to the desired phase information. The painstaking adjustment process characteristic of the prior art is eliminated. Furthermore, the adaptation process performed by the present modulator is continuous, operating whenever the modulator is turned on. The effects of environmental conditions, component variations, component aging, etc., can all be compensated for.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An RF modulator comprising:

a phase lock loop including a loop filter and receiving as an input signal a baseband modulation signal and producing as an output signal a modulated RF signal;

circuitry for producing an injection modulation signal;

circuitry for injecting the injection modulation signal into the phase lock loop at a point past the loop filter; and control circuitry, coupled to the circuitry for injecting the injection modulation signal, for controlling the amplitude of the injection modulation signal.

2. The apparatus of claim 1, wherein said circuitry for injecting comprises an adaptive gain amplifier.

3. The apparatus of claim 2, wherein said control circuitry includes a phase demodulator.

4. The apparatus of claim 3, wherein said phase demodulator is digital.

5. The apparatus of claim 4, wherein said control circuitry further comprises a comparison circuit.

6. The apparatus of claim 5, wherein the comparison circuit compares the baseband modulation signal to a phase information signal recovered by the phase demodulator and produces an error signal.

7. The apparatus of claim 6, wherein said error signal is used to set the gain of the adaptive gain amplifier.

8. The apparatus of claim 1, further comprising a direct digital synthesis circuit for receiving the baseband modulation signal, producing a corresponding modulated signal, and applying the modulated signal to the phase lock loop.

9. The apparatus of claim 8, wherein the direct digital synthesis circuit includes a number controlled modulated oscillator.

10. The apparatus of claim 1, wherein said phase lock loop includes a divide by N counter.

11. The apparatus of claim 1, wherein said phase lock loop includes a downconverter.

12. The apparatus of claim 1, further comprising a amplitude modulation stage coupled to the output signal of the phase lock loop.

13. A method of producing precise, stable phase shifts in a modulated RF signal, comprising the steps of:

using a baseband modulation signal, producing a modulated signal;

applying the modulated signal as a reference signal to a phase lock loop; and automatically deriving an adaptive gain factor and applying the adaptive gain factor to the baseband modulation signal to produce an injection signal and injecting the injection signal into the phase lock loop;

wherein the injection signal compensates for the phase lock loop partially removing modulation introduced by the baseband modulation signal.

14. The method of claim 13, wherein automatically deriving an adaptive gain factor comprises:

recovering phase information from an output signal of the phase lock loop;

comparing the phase information to the baseband modulation signal and producing an error signal, the adaptive gain factor being derived from the error signal.

* * * * *